(12) United States Patent
Pan et al.

(10) Patent No.: US 10,932,361 B2
(45) Date of Patent: Feb. 23, 2021

(54) CIRCUIT BOARD AND ELECTRONIC DEVICE

(71) Applicant: Industrial Technology Research Institute, Hsinchu (TW)

(72) Inventors: Cheng-Ta Pan, Kaohsiung (TW);
Hsien-Chie Cheng, Hsinchu (TW);
Zi-Hao Ye, Kaohsiung (TW);
Kung-Chieh Huang, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 9 days.

(21) Appl. No.: 16/431,695

(22) Filed: Jun. 4, 2019

(65) Prior Publication Data

US 2019/0373721 A1 Dec. 5, 2019

Related U.S. Application Data

(60) Provisional application No. 62/679,988, filed on Jun. 4, 2018.

(30) Foreign Application Priority Data

May 9, 2019 (TW) .................................. 108115969

(51) Int. Cl.
*H05K 1/00* (2006.01)
*H05K 1/02* (2006.01)

(52) U.S. Cl.
CPC ......... *H05K 1/0283* (2013.01); *H05K 1/0296* (2013.01); *H05K 2201/09063* (2013.01); *H05K 2201/09263* (2013.01)

(58) Field of Classification Search
CPC ............... H05K 1/0283; H05K 1/0296; H05K 2201/09263; H05K 2201/09063; H05K 1/189
See application file for complete search history.

(56) References Cited

U.S. PATENT DOCUMENTS 9,299,940 B2 3/2016 Takei et al.
2003/0146808 A1* 8/2003 Merrill .................... H01P 9/006
333/161

(Continued)

FOREIGN PATENT DOCUMENTS

CN 104377205 7/2017
CN 107990822 5/2018

(Continued)

OTHER PUBLICATIONS

"Office Action of Taiwan Counterpart Application", dated Mar. 9, 2020, p. 1-p. 5.

*Primary Examiner* — Yuriy Semenenko
(74) *Attorney, Agent, or Firm* — JCIPRNET

(57) ABSTRACT

A circuit board includes a substrate and at least one circuit structure. The substrate has first slots, each first slot extends along a first axis, and a length of each first slot along the first axis is greater than lengths of each first slot along other directions. The circuit structure is disposed on the substrate and includes arc segments and extending segments. Each arc segment is connected between two of the extending segments such that the circuit structure is circuitous. The circuit structure and each first slot have an interval therebetween such that each first slot and a part of a surface of the substrate are exposed by the circuit structure. Each first slot is located between adjacent two extending segments, and the first axis of each first slot passes through the corresponding arc segment. In addition, an electronic device having the circuit board is also provided.

22 Claims, 18 Drawing Sheets

(56) References Cited

U.S. PATENT DOCUMENTS

| | | | |
|---|---|---|---|
| 2011/0074380 A1* | 3/2011 | Jeon | D03D 13/00 |
| | | | 323/318 |
| 2015/0065840 A1* | 3/2015 | Bailey | A61B 5/0492 |
| | | | 600/384 |
| 2015/0124566 A1* | 5/2015 | Lake | G04G 21/08 |
| | | | 368/10 |
| 2016/0020500 A1* | 1/2016 | Matsuda | H05K 3/42 |
| | | | 333/238 |
| 2016/0136877 A1 | 5/2016 | Rogers et al. | |
| 2016/0285410 A1 | 9/2016 | Forrest et al. | |
| 2016/0299270 A1 | 10/2016 | Kotov et al. | |
| 2017/0182723 A1 | 6/2017 | Calisch et al. | |
| 2018/0316105 A1* | 11/2018 | Wang | H01P 5/028 |
| 2018/0317845 A1* | 11/2018 | Chong Rodriguez | |
| | | | A61B 5/6804 |

FOREIGN PATENT DOCUMENTS

| | | |
|---|---|---|
| CN | 207340275 | 5/2018 |
| TW | I339087 | 3/2011 |
| TW | I475284 | 3/2015 |
| TW | I596534 | 8/2017 |
| TW | I637986 | 10/2018 |

\* cited by examiner

US 10,932,361 B2

CIRCUIT BOARD AND ELECTRONIC DEVICE

CROSS-REFERENCE TO RELATED APPLICATION

This application claims the priority benefits of U.S. provisional application No. 62/679,988, filed on Jun. 4, 2018, and Taiwan application no. 108115969, filed on May 9, 2019. The entirety of each of the above-mentioned patent applications is hereby incorporated by reference herein and made a part of this specification.

TECHNICAL FIELD

The disclosure relates to a circuit board and an electronic device.

BACKGROUND

Currently, the development of wearable devices progresses rapidly. Such devices include smart bracelets, wristband, watches, head-mounted display devices, clothes, etc. Relevant applications come in a wider and wider variety, not only covering the fields of healthcare, entertainment, etc., but also playing a role in people's daily life as well as sports and recreation.

By applying a stretchable circuit board to a wearable device, the wearable device may measure the state of a human body more accurately, and the user may wear the wearable device with greater comfort. However, the circuit structure of the circuit board may be damaged or broken easily due to stretching of the circuit board. Under such circumstance, the resistance of the circuit structure may increase rapidly and affect the normal performance of the circuit structure.

SUMMARY

A circuit board according to an embodiment of the disclosure includes a substrate and at least one circuit structure. The substrate has a plurality of first slots, each of the first slots extends along a first axis, and a length of each of the first slots along the first axis is greater than lengths of each of the first slots along other directions. The circuit structure is disposed on the substrate and includes a plurality of arc segments and a plurality of extending segments. Each of the arc segments is connected between two of the extending segments such that the circuit structure is circuitous. The circuit structure and each of the first slots have an interval therebetween such that each of the first slots and a part of a surface of the substrate are exposed by the circuit structure. Each of the first slots is located between adjacent two extending segments of the extending segments, and the first axis of each of the first slots passes through the corresponding arc segment.

An electronic device according to an embodiment of the disclosure includes a circuit board and two electronic components. The circuit board includes a substrate and at least one circuit structure. The substrate has a plurality of first slots, each of the first slots extends along a first axis, and a length of each of the first slots along the first axis is greater than lengths of each of the first slots along other directions. The circuit structure is disposed on the substrate and includes a plurality of arc segments and a plurality of extending segments. Each of the arc segments is connected between two of the extending segments such that the circuit structure is circuitous. The circuit structure and each of the first slots have an interval therebetween such that each of the first slots and a part of a surface of the substrate are exposed by the circuit structure. Each of the first slots is located between adjacent two extending segments of the extending segments, and the first axis of each of the first slots passes through the corresponding arc segment. Two electronic components are electrically connected to each other through the circuit board.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
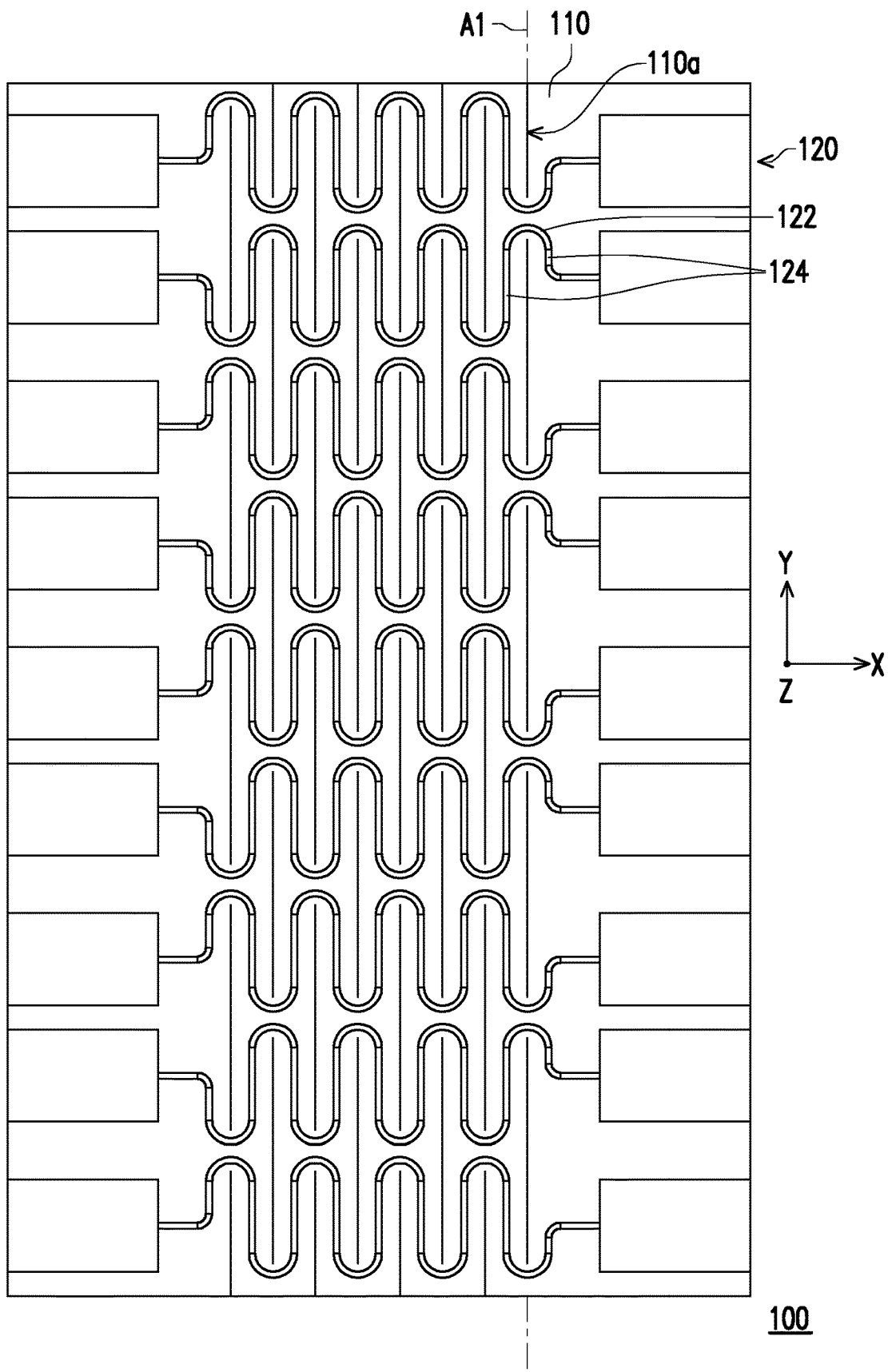
FIG. 1 is a top view of a circuit board according to an embodiment of the disclosure.
Figure 2:
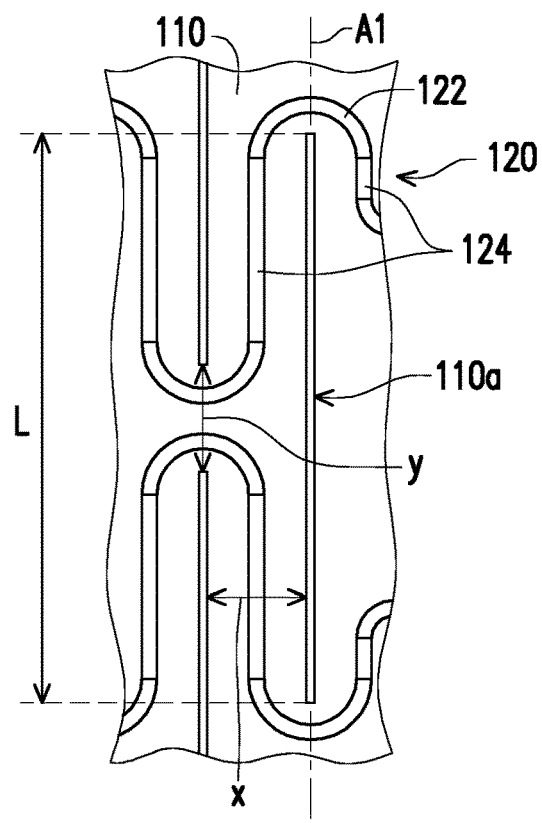
FIG. 2 is a partially enlarged view of the circuit board of FIG. 1.

FIG. 1 is a top view of a circuit board according to an embodiment of the disclosure. FIG. 2 is a partially enlarged view of the circuit board of FIG. 1. Referring to FIGS. 1 and 2, a circuit board 100 of the embodiment includes a substrate 110 and at least one circuit structure 120 (multiple circuit structures 120 are shown herein). The substrate 110 has a plurality of first slots 110a. Each of the first slots 110a extends along a first axis A1. A length of each of the first slots 110a along the first axis A1 is greater than lengths of each of the first slots 110a along other directions. Each circuit structure 120 is disposed on the substrate 110 and includes a plurality of arc segments 122 and a plurality of extending segments 124. Each of the arc segments 122 is connected between adjacent two extending segments 124 so that the circuit structure 120 is circuitous. Each of the first slots 110a is located between adjacent two extending segments 124. Through deformation of the first slots 110a and the arc segments 122, the circuit board 100 may be stretched along a direction X perpendicular to the first axis A1, so as to render a one-dimensional stretching effect.

As shown in FIGS. 1 and 2, the circuit structure 120 and each of the first slots 110a of the substrate 110 has an interval therebetween, so that each of the first slots 110a and a part of a surface of the substrate 110 are exposed by the circuit structure 120. In other words, the circuit structure 120 does not entirely cover the surface of the substrate 110, but only covers a part of the surface of the substrate 110, so that the circuit structure 120 is not excessively close to the first slot 110a of the substrate 110. Accordingly, when the circuit board 100 is stretched, the stress concentration occurring at the end of the first slot 110a of the substrate 110 is not directly transmitted to the circuit structure 120. In this way, the circuit structure 120 may be effectively prevented from being damaged or broken due to stretching of the circuit board 100.

Besides, in the embodiment, the extending axis (i.e., the first axis A1) of each of the first slots 110a passes through the corresponding arc segment 122, so that the arc segment 122 is adjacent to the end of the first slot 110a. In this way, the extent of stress concentration may be further reduced by using the arc segment 122 without a pointy tip.

In the embodiment, each of the first slots 110a of the substrate 110 is a slit and is a linear slot, for example. Each of the extending segments 124 of the circuit structure 120 is disposed on a straight line, and each adjacent two extending segments 124 are parallel to each other. A ratio L/x of a length L of each of the first slots 110a along the first axis A1 to a distance x between adjacent two first slots 110a along a direction perpendicular to the first axis A1 is greater than 5, for example, to maintain a stable stretching property.

The disclosure does not intend to limit the form of the slot. In the following, examples in this regard are described with reference to FIGS. 3 to 8.

Figure 3:
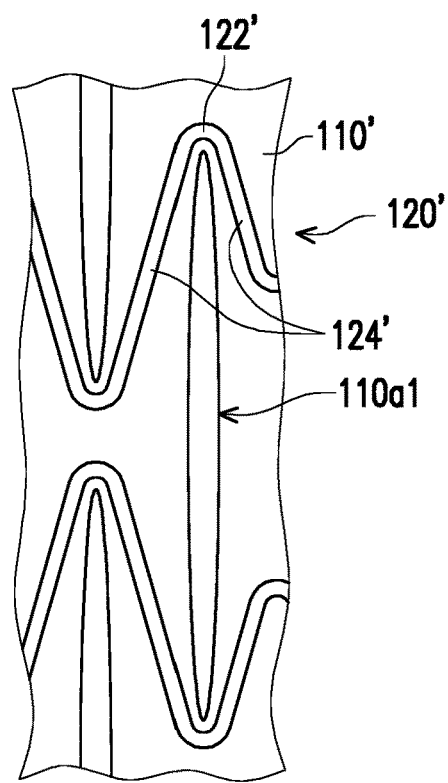
FIG. 3 is a partially enlarged view of a circuit board according to another embodiment of the disclosure.
Figure 4:
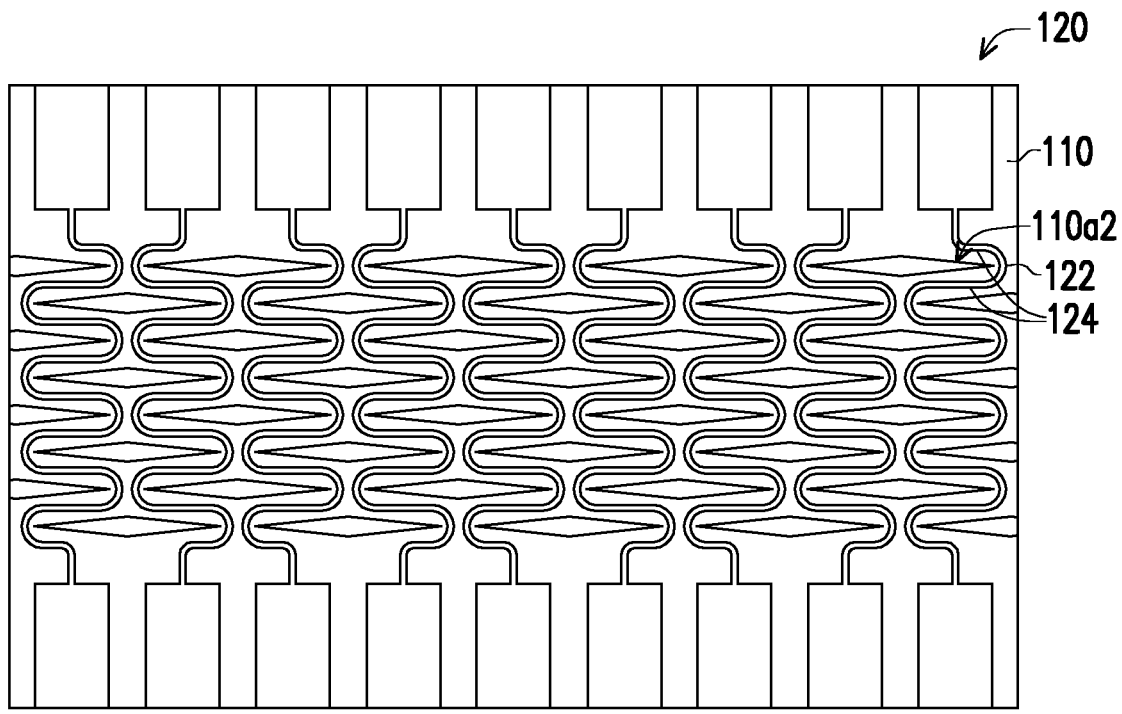
FIGS. 4 to 8 illustrate circuit boards according to other embodiments of the disclosure.
Figure 5:
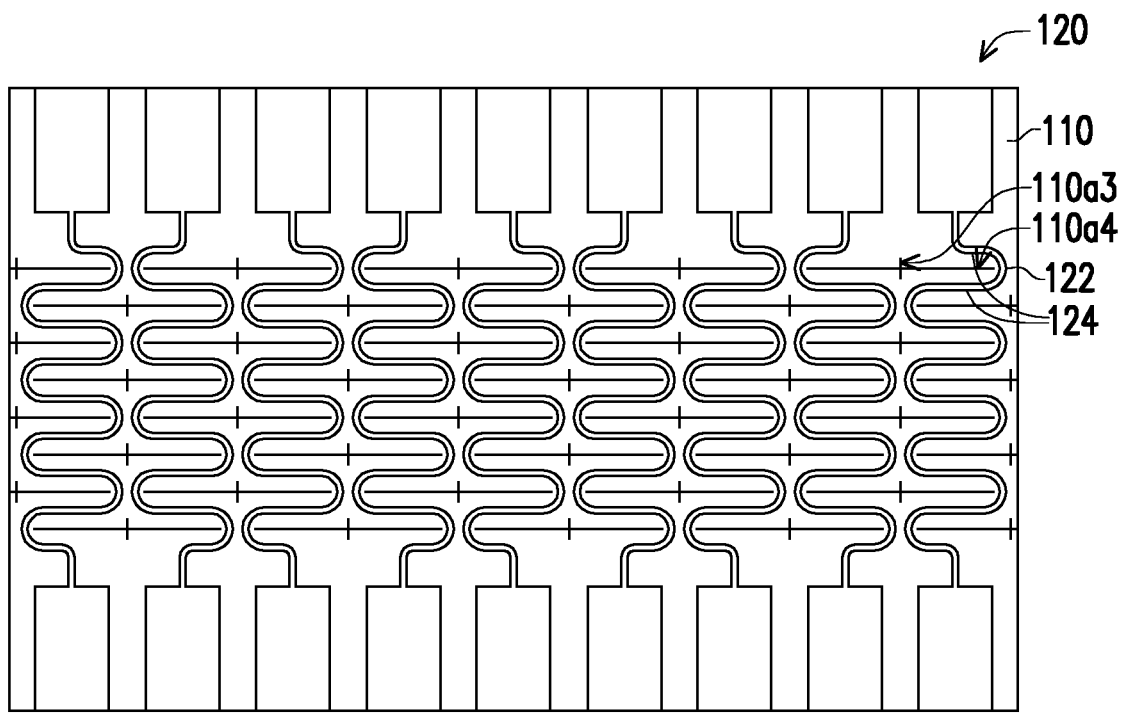
Figure 6:
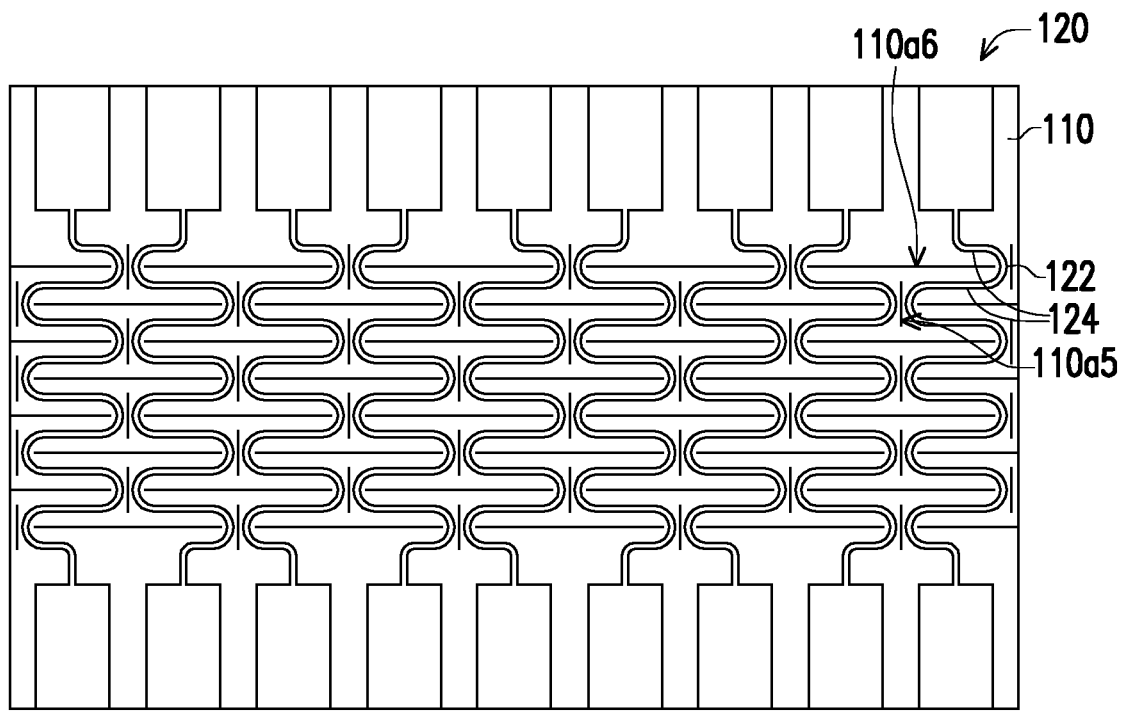
Figure 7:
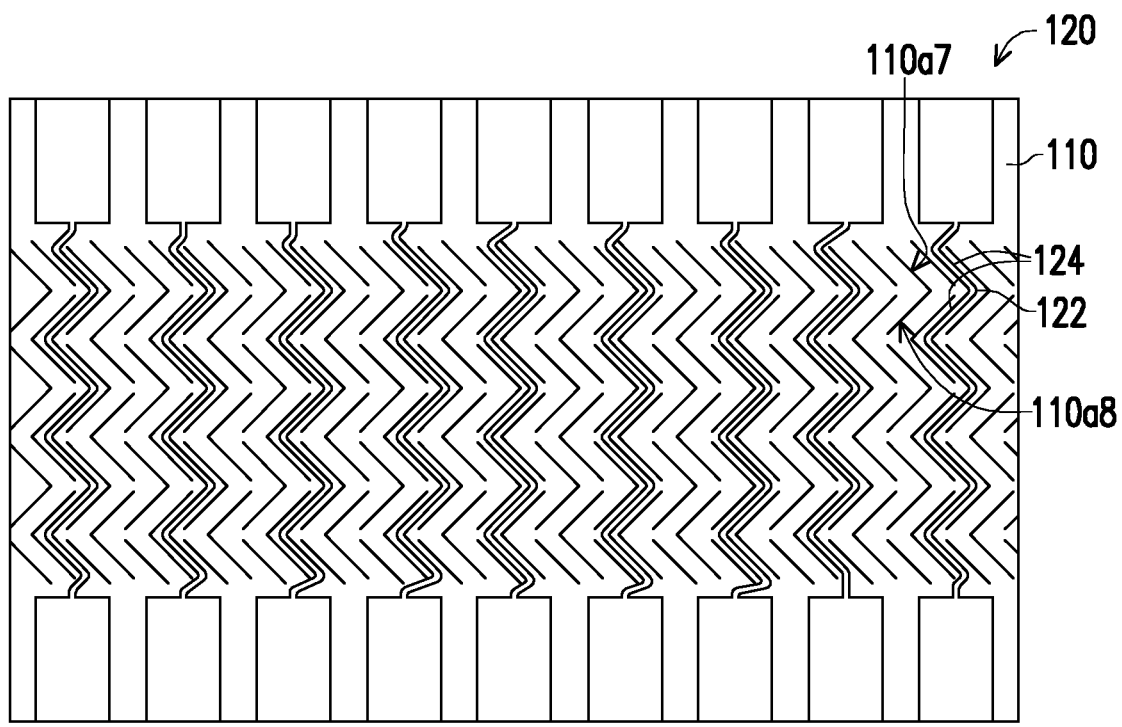
Figure 8:
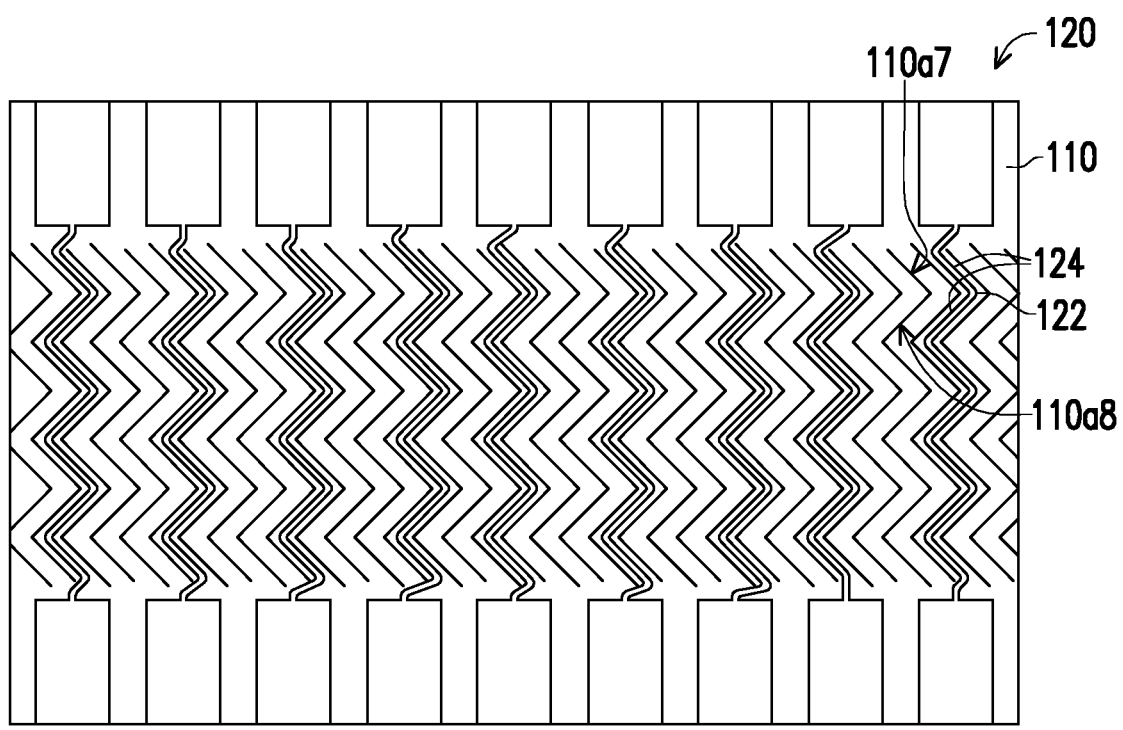

FIG. 3 is a partially enlarged view of a circuit board according to another embodiment of the disclosure. As shown in FIG. 3, each first slot 110a1 of a substrate 110' is an oval slot, so as to provide a two-dimensional stretching effect. In addition, adjacent two stretching segments 124' connected to an arc segment 122' in a circuit structure 120' are inclined with respect to each other correspondingly to the shape of the first slot 110a1. FIGS. 4 to 8 illustrate circuit boards according to other embodiments of the disclosure. As shown in FIG. 4, each first slot 110a2 is a rhombus slot, so as to provide a two-dimensional stretching effect. As shown in FIG. 5, linear-shaped first slots 110a3 and 110a4 intersect each other and have extending directions perpendicular to each other, so as to provide a two-dimensional stretching effect. As shown in FIG. 6, the extending directions of linear-shaped first slots 110a5 and 110a6 not intersecting each other are perpendicular to each other, so as to provide a two-dimensional stretching effect. As shown in FIGS. 7 and 8, the extending directions of linear-shaped first slots 110a7 and 110a8 intersecting each other are different and inclined, so as to provide a two-dimensional stretching effect. What FIG. 8 differs from FIG. 7 is that FIG. 8 shows more the first slots 110a7 and the second slots 110a8 successively connected to form continuous slot structures. In other embodiments, the first slot may be a rectangular slot, a hexagon slot, or slots in other shapes. The disclosure does not intend to impose a limitation on this regard.

In other embodiments, a plurality of circuit structures, chips, passive electronic components, or active electronic components having different design parameters may be integrated on the same substrate. In the following, examples in this regard are described with reference to FIGS. 9 and 10.

Figure 9:
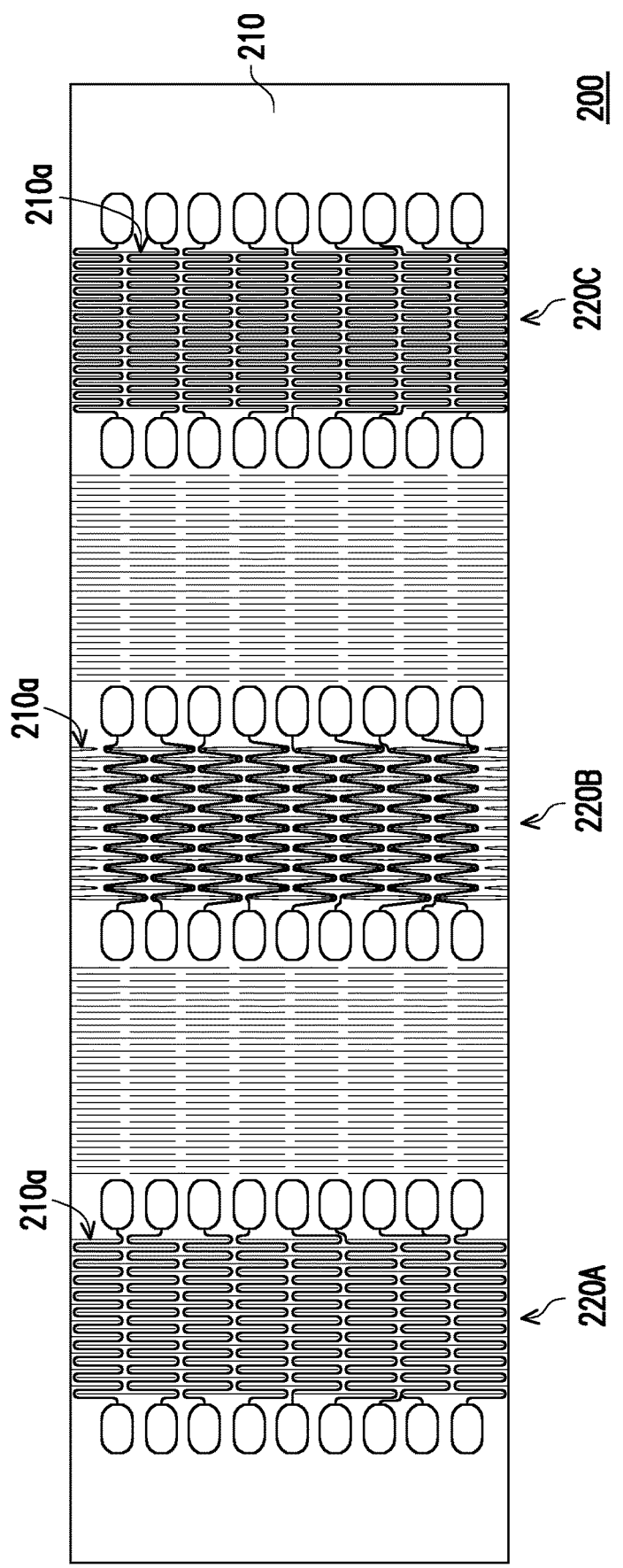
FIG. 9 is a top view of a circuit board according to another embodiment of the disclosure.

FIG. 9 is a top view of a circuit board according to another embodiment of the disclosure. In a circuit board 200 of FIG. 9, the configurations and functioning of a substrate 210, first slots 210a of the substrate 210, circuit structures 220A, 220B, and 220C are similar to the configurations and functioning of the substrates, the first slots thereof, and the circuit structures in the above embodiments. Therefore, details in this regard will not be repeated in the following. What the embodiment shown in FIG. 9 differs from the above embodiments is that the circuit structures 220A, 220B, and 220C respectively having different design parameters are respectively disposed in different regions of the substrate 210. The forms of the circuit structures 220A and 220C and the corresponding first slots 210a are similar to the forms of the circuit structure 120 and the corresponding first slots 110a shown in FIG. 1, for example, and the forms of the circuit structure 220B and the corresponding first slots 210a are similar to the circuit structure 120' and the corresponding first slots 110a1 shown in FIG. 3. In addition, the ratio of the length of the first slot 210a to the distance between adjacent two first slots 210a (such as the ratio L/x) of the circuit structure 220A is smaller than the ratio of the circuit structure 220C but greater than the ratio of the circuit structure 220B. In other words, the different design parameters include different slot shapes as well as different ratios of the circuit structures. For example, the ratio of the length of the first slot 210a to the distance between adjacent two first slots 210a of the circuit structure 220A is 13, for example, the ratio of the circuit structure 220B is 8, for example, and the ratio of the circuit structure 220C is 17, for example. However, the disclosure is not limited thereto. Besides, the design parameter may also include a ratio L/y of the length L of each of the first slots 110a along the first axis A1 to a distance y between adjacent two first slots 110a along a direction parallel to the first axis A1. The disclosure does not intend to impose a limitation on this regard.

Accordingly, in the circuit board 200, the circuit structure 220A has an intermediate stretching effect, the circuit structure 220B has a smaller, two-dimensional stretching effect, and the circuit structure 220C has a greater stretching effect. For example, the circuit structures 220A, 220B, and 220C may be disposed to respectively correspond to the user's shoulder, bicep, and elbow, so as to exhibit the intermediate stretching effect required by the shoulder, the smaller, two-dimensional stretching effect required by the biceps, and the greater stretching effect required by the elbow. Nevertheless, the disclosure does not intend to impose a limitation on this regard.

Figure 10:
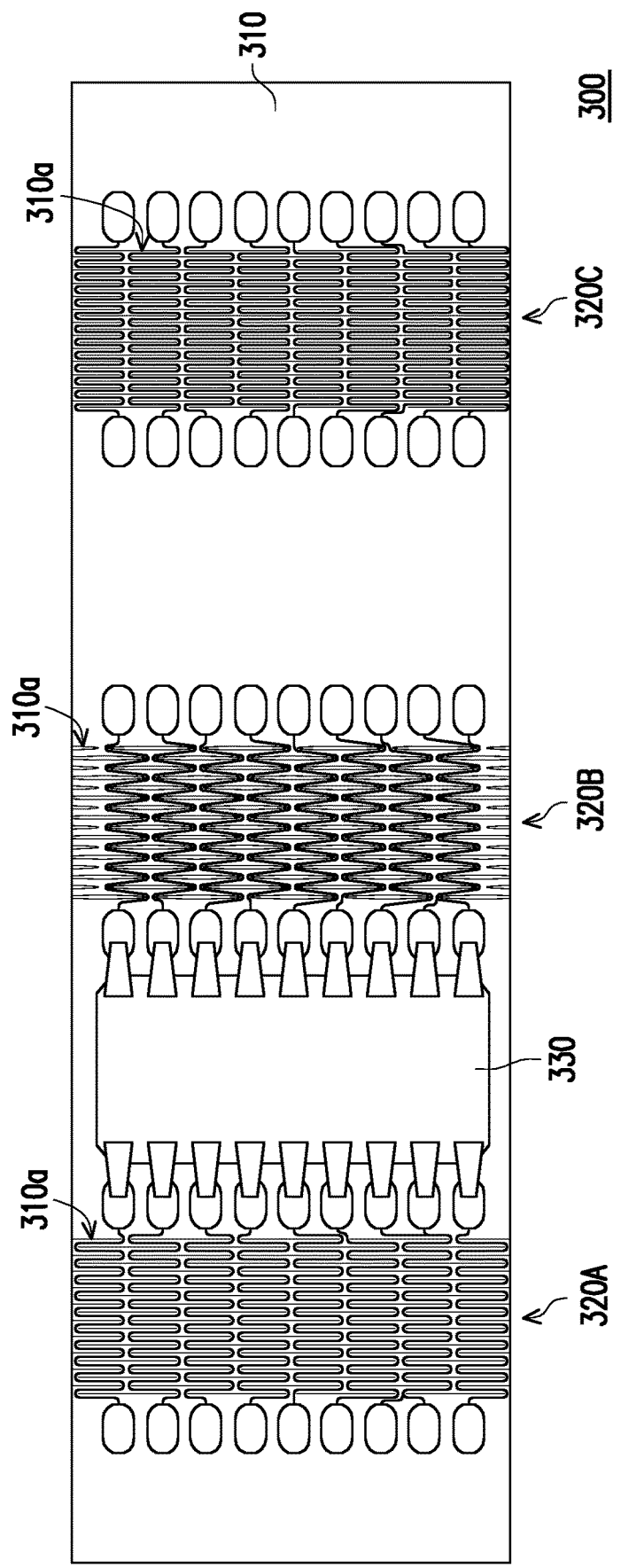
FIG. 10 is a top view of a circuit board according to another embodiment of the disclosure.

FIG. 10 is a top view of a circuit board according to another embodiment of the disclosure. In a circuit board 300 of FIG. 10, the configurations and functioning of a substrate 310, first slots 310a of the substrate 310, and circuit structures 320A, 320B, and 320C are similar to the configurations and functioning of the substrate 210, the first slots 210a of the substrate 210, and the circuit structures 220A, 220B, and 220C of FIG. 9. Therefore, details in this regard will not be repeated in the following. What the embodiment shown in FIG. 10 differs from the embodiment shown in FIG. 9 is that the circuit board 300 further includes a chip 330. The chip 330 is disposed on the substrate 310 and is electrically connected to the circuit structures 320A and 320B. The chip 330 is a non-stretchable component. In other words, the circuit board 300 shown in FIG. 10 integrates a stretchable structure and a non-stretchable structure. The chip 330 may be replaced with a passive component, such as a resistor, a capacitor, an inductor, etc., or an active component different from the passive component, such as a transistor. The disclosure does not intend to impose a limitation on this regard.

Figure 11:
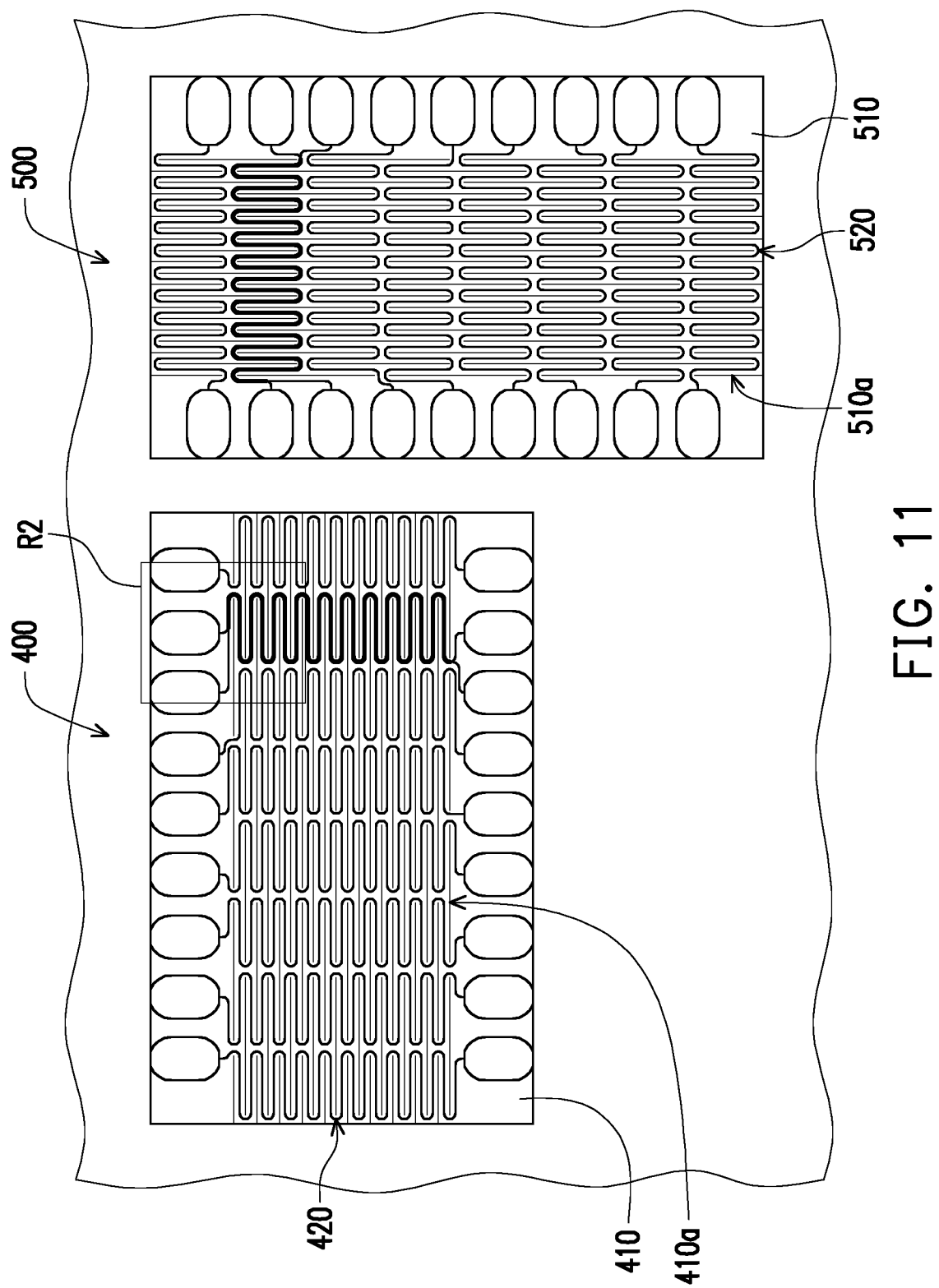
FIG. 11 is a schematic view illustrating that a plurality of circuit boards are assembled according to another embodiment of the disclosure.

FIG. 11 is a schematic view illustrating that a plurality of circuit boards are assembled according to another embodiment of the disclosure. In circuit boards 400 and 500 of FIG. 11, the configurations and functioning of a substrate 410, first slots 410a of the substrate 410, and circuit structures 420 as well as the configurations and functioning of a substrate 510, the first slots 410a of the substrate 510, and circuit structures 520 are similar to the configurations and functioning of the substrates, the first slots thereof, and the circuit structures in the above embodiments. Therefore, details in this regard will not be repeated in the following. What the embodiment shown in FIG. 10 differs from the above embodiments is that the circuit board 400 and the circuit board 500 are respectively disposed in different orientations and assembled to each other, so as to provide stretching effects in different directions for adjacent parts of the user's body.

Figure 12:
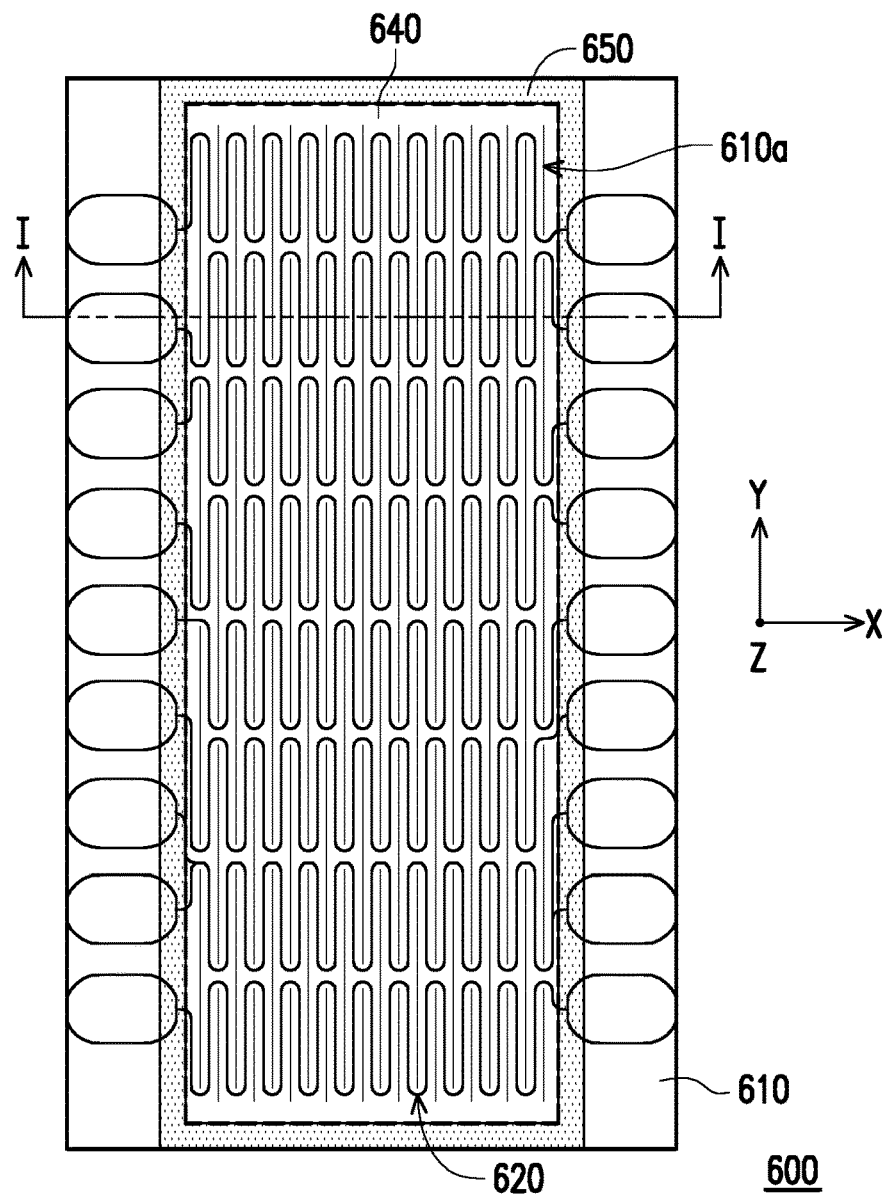
FIG. 12 is a top view of a circuit board according to another embodiment of the disclosure.
Figure 13:
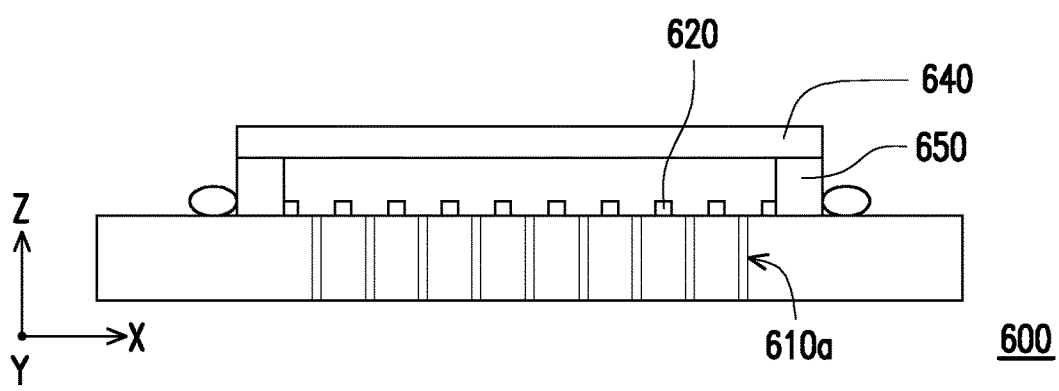
FIG. 13 is a cross-sectional view along a line I-I in the circuit board of FIG. 12.

FIG. 12 is a top view of a circuit board according to another embodiment of the disclosure. FIG. 13 is a cross-sectional view along a line I-I in the circuit board of FIG. 12. For clearer illustration, FIG. 13 only schematically illustrates circuit structures 620. In a circuit board 600 of FIG. 12, the configurations and functioning of a substrate 610, first slots 610a of the substrate 610, and the circuit structures 620 are similar to the configurations and functioning of the substrates, the first slots of the substrates, and the circuit structures in the above embodiments. Therefore, details in this regard will not be repeated in the following. What the embodiment shown in FIG. 12 differs from the above embodiments is that the circuit board 600 further includes a protective layer 640 and a support structure 650. In addition, the materials of the protective layer 640 and the support structure 650 are insulating materials, for example. The protective layer 640 is disposed on the substrate 610 and shields the circuit structure 620, so as to prevent the circuit structure 620 from directly contacting an external object and being damaged. The support structure 650 provides support between the substrate 610 and the protective layer 640 to ensure an interval between the protective layer 640 and the substrate 610. The interval prevents the substrate 610 and the first slots 610a of the substrate 610 from being limited by the protective layer 640 in a direction Z when being stretched to deform and thereby ensures smooth deformation.

Figure 14:
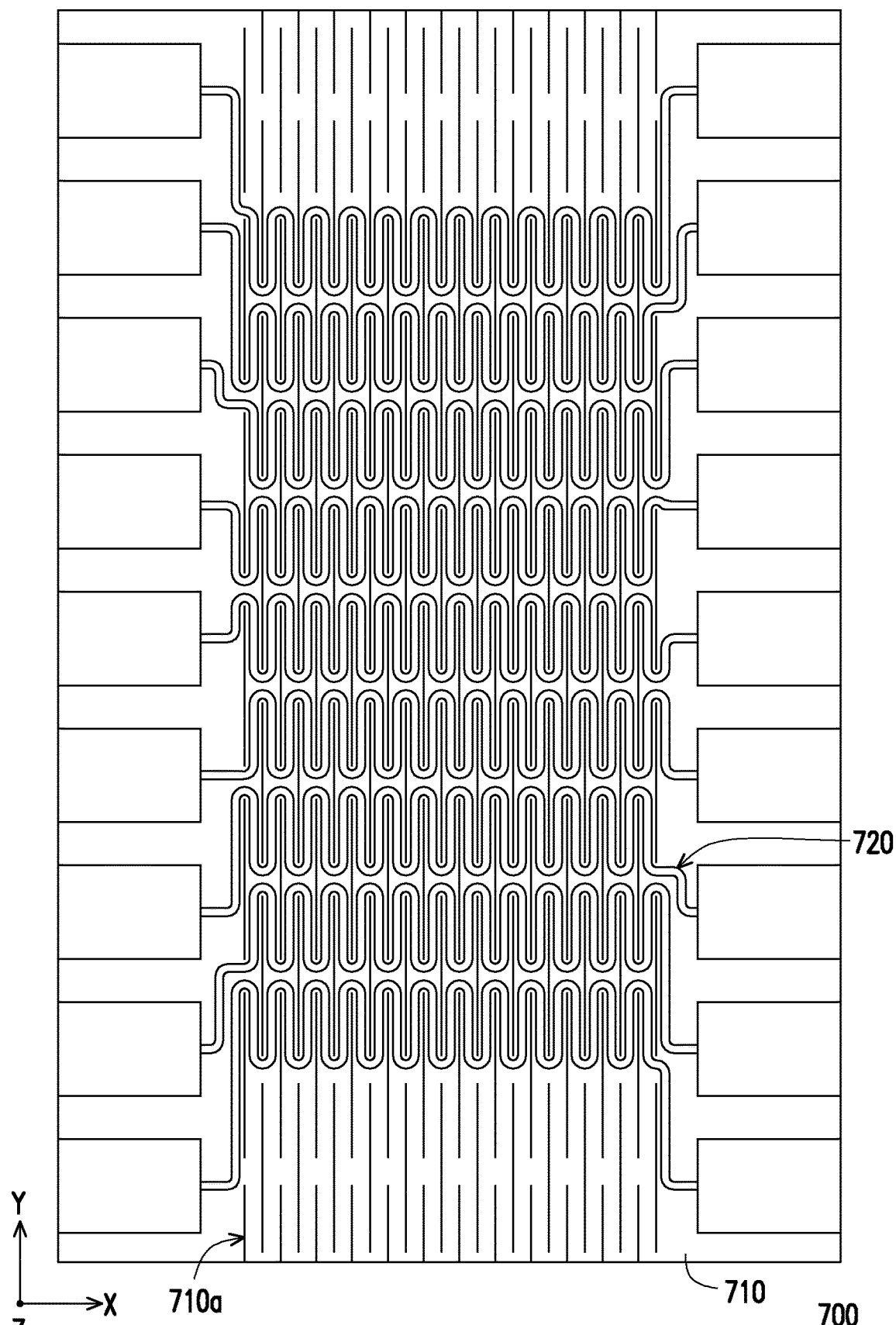
FIG. 14 is a top view of a circuit board according to another embodiment of the disclosure.
Figure 15:
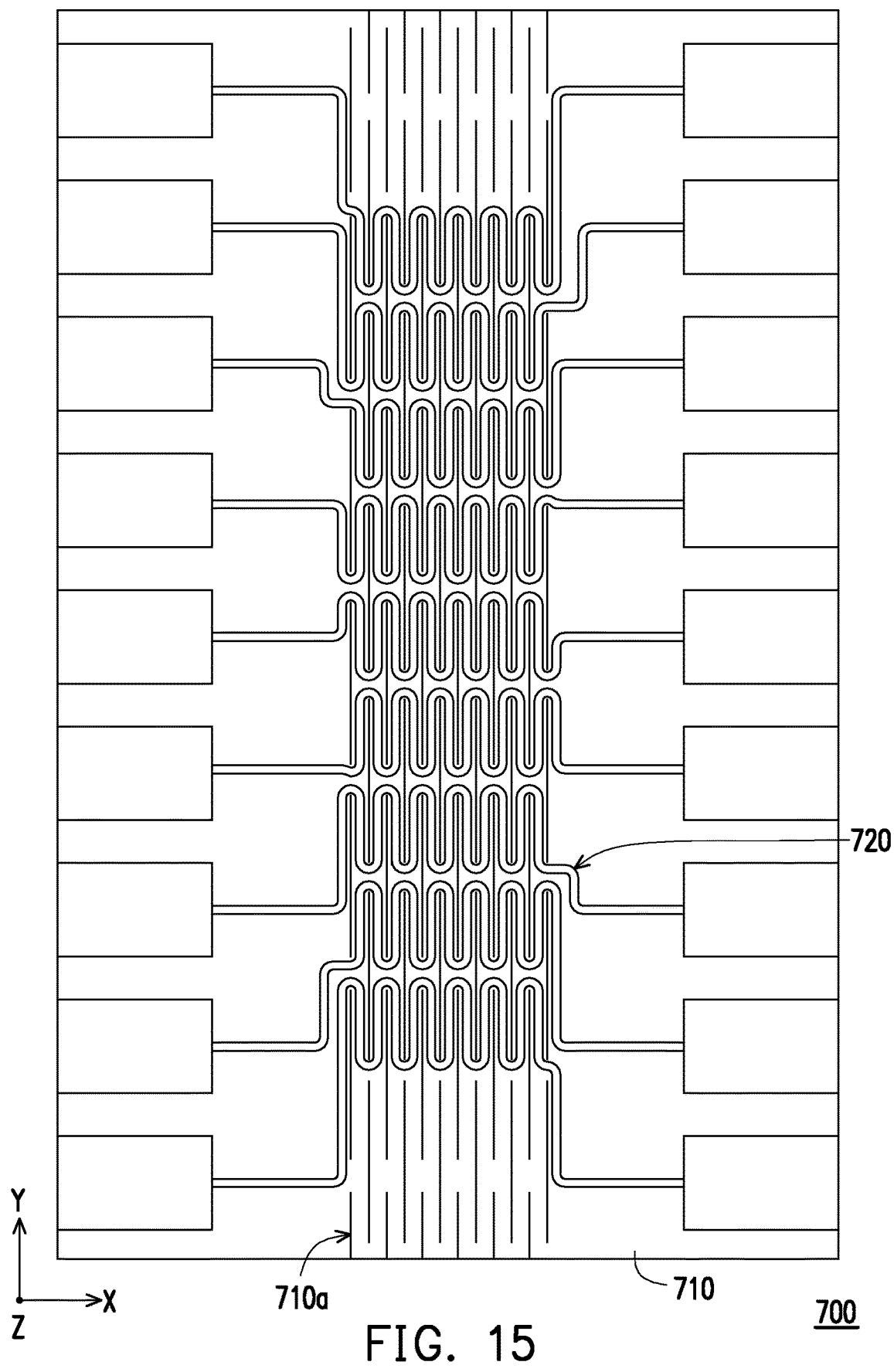
FIG. 15 illustrates that a distributed range of first slots and circuit structures of FIG. 14 is reduced.

FIG. 14 is a top view of a circuit board according to another embodiment of the disclosure. FIG. 15 illustrates that a distributed range of first slots and circuit structures of FIG. 14 is reduced. In a circuit board 700 of FIGS. 14 and 15, the configurations and functioning of a substrate 710, first slots 710a of the substrate 710, and the circuit structures 720 are similar to the configurations and functioning of the substrates, the first slots of the substrates, and the circuit structures in the above embodiments. Therefore, details in this regard will not be repeated in the following. The difference between the embodiment shown in FIG. 14 and the embodiment shown in FIG. 15 is described in the following. The first slots 710a and the circuit structures 720 of FIG. 14 have a greater distributed range in the central region of the substrate 710. Such a configuration allows the circuit board 700 to be more stretchable and deformable, thereby reducing the plastic strain when the circuit board 700 is stretched. The first slots 710a and the circuit structures 720 of FIG. 15 have a smaller distributed range in the central region of the substrate 710. Such a configuration reduces the distributed range of the circuitous circuit structures 720, thereby reducing the initial resistance of the circuit board 700. In a design, the configuration shown in FIG. 14 may be chosen to reduce the plastic strain, or the configuration shown in FIG. 15 may be chosen to reduce the initial resistance.

In Table 1 in the following (the results of one stretch), a comparison on the plastic strains, the initial resistances, and the resistance variation rates based on the initial resistances between the embodiment shown in FIG. 14 and the embodiment shown in FIG. 15 is made based on the results calculated by finite element simulation software.

| Range of circuit L/x coverage | Number of first slots along direction Y | Number of circuitousness of each circuit structure | Maximum plastic strain (%) | Initial resistance (Ω) | Resistance variation rate (%) |
|---|---|---|---|---|---|
| 10 Small | 6.5 | 6 | 4.91 | 13.40 | 1.42 |
| Large | 6.5 | 12 | 1.55 | 21.18 | 0.12 |

As shown in Table 1 above, the ratio L/x (such as the above ratio L/x) of the length of the first slot 710a to the distance between adjacent two first slots 710a in the embodiment shown in FIG. 14 is equal to the ratio of the embodiment shown in FIG. 15. For example, both ratios may be 10. In addition, the numbers of the first slots 710a along the direction Y in the embodiment shown in FIG. 14 and the embodiment shown in FIG. 15 may both be 6.5, for example. Under the premise, based on the difference between the entirely filled configuration in the embodiment shown in FIG. 14 and the non-entirely filled configuration in the embodiment shown in FIG. 15, the maximum plastic strain of the circuit board 700 of FIG. 14 is 1.55%, lower than the maximum plastic strain of 4.91% of the circuit board 700 of FIG. 15, when the circuit boards 700 in the embodiments shown in FIGS. 14 and 15 are stretched. In addition, the initial resistance of the circuit board 700 of FIG. 14 is 21.18Ω, higher than the initial resistance of 13.40Ω of the circuit board 700 of FIG. 15. Moreover, when the circuit boards 700 in the embodiments shown in FIGS. 14 and 15 are stretched, the resistance variation rate of the circuit board 700 of FIG. 14 is 1.42%, higher than the resistance variation rate of 0.12% of the circuit board 700 of FIG. 15.

Figure 16:
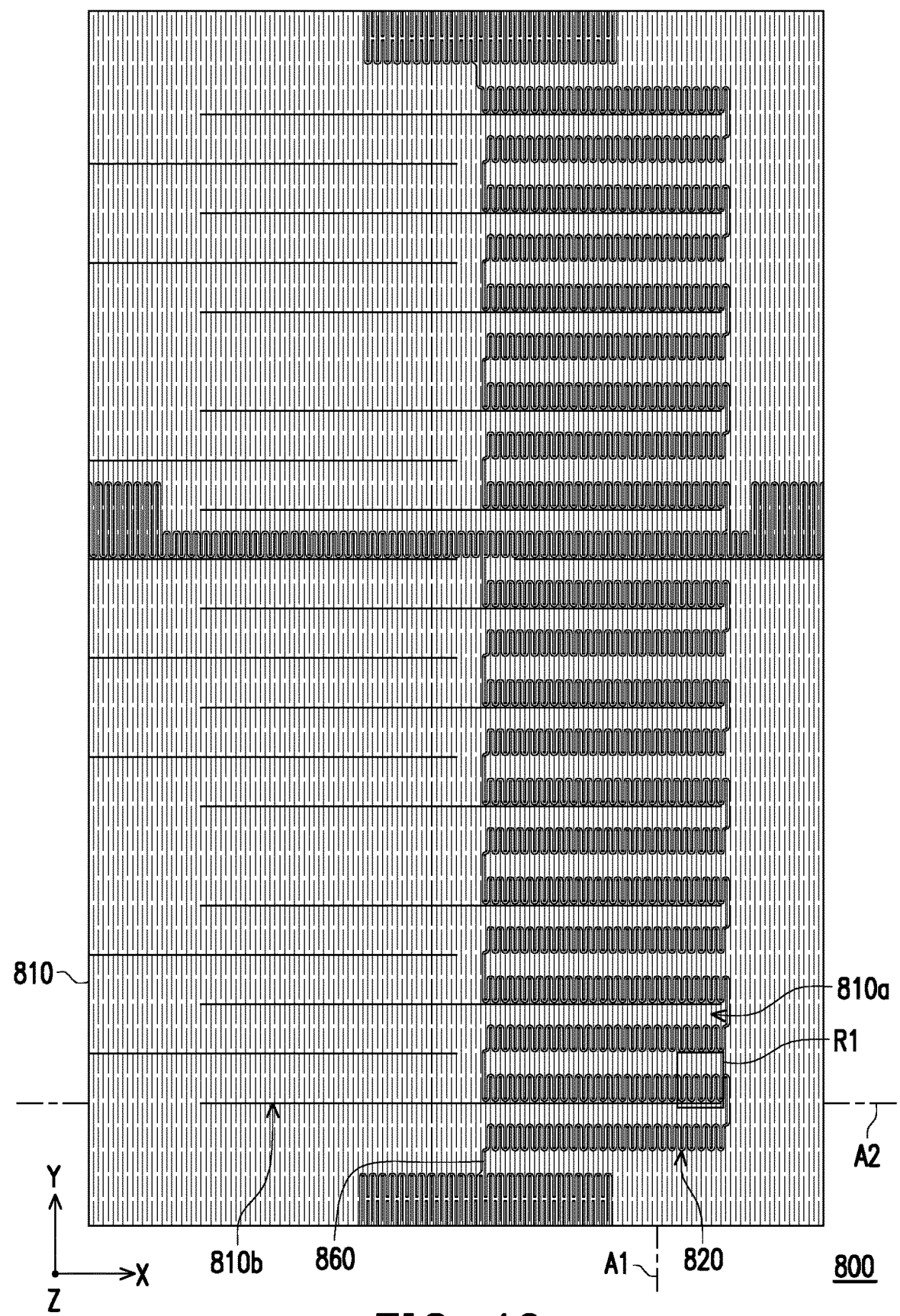
FIG. 16 is a top view of a circuit board according to another embodiment of the disclosure.
Figure 17:
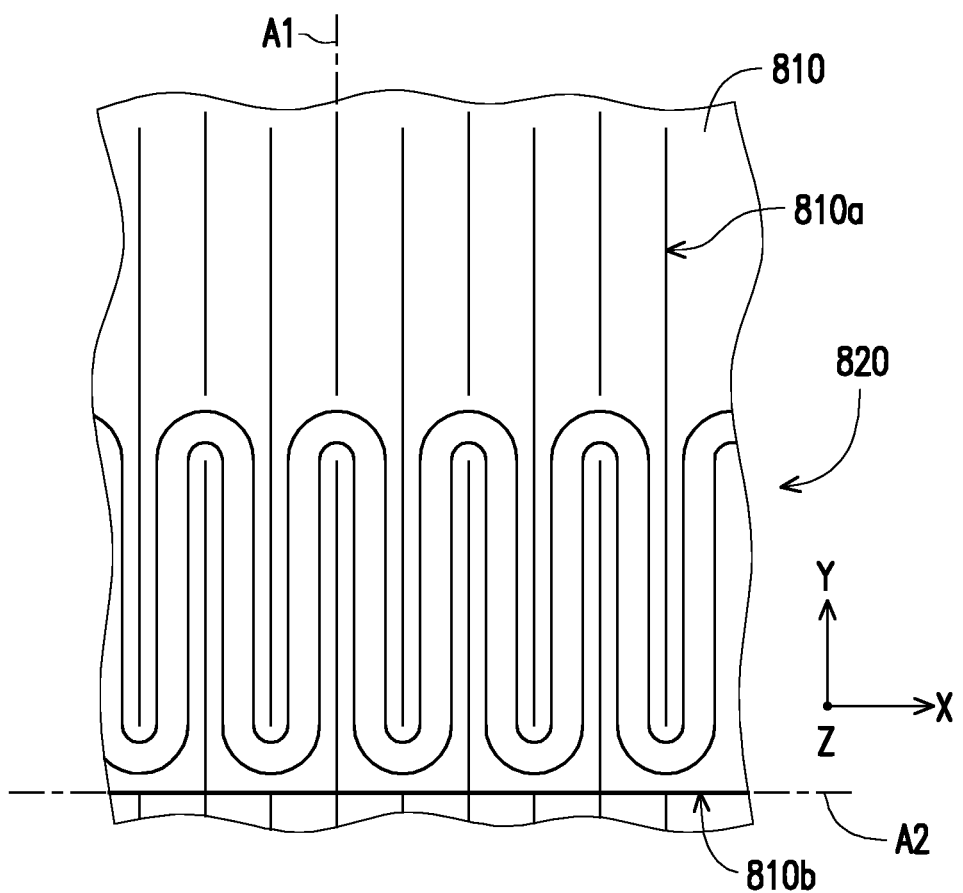
FIG. 17 is a partially enlarged view of the circuit board of FIG. 16.

FIG. 16 is a top view of a circuit board according to another embodiment of the disclosure. FIG. 17 is a partially enlarged view of the circuit board of FIG. 16, wherein FIG. 17 corresponds to a region R1 of FIG. 16. In the embodiment shown in FIGS. 16 and 17, the configurations and functioning of a substrate 810, first slots 810a of the substrate, and circuit structures 820 are similar to the configurations and functioning of the substrates, the first slots, and the circuit structures in the above embodiments. Therefore, details in this regard will not be repeated in the following. What the embodiment shown in FIGS. 16 and 17 differs from the above embodiments is that the circuit board 800 further includes a plurality of connection circuits 860. Each of the connection circuits 860 is connected between two circuit structures 820, so that the circuit structures 820 and the connection circuits 860 together form a circuitous structure. The substrate 810 further includes a plurality of second slots 810b. Each of the second slots 810b is located between adjacent two circuit structures 820. Each of the second slots 810b extends along a second axis A2 perpendicular to the first axis A1. The circuit board 800 may be stretched along a direction perpendicular to the second axis A2 through deformation of the second slots 810b and the connection circuits 860. In other words, in the embodiment shown in FIGS. 16 and 17, in addition to the respective circuit structures 820 configured as circuitous as shown in FIG. 17 to be used with the first slots 810a and provide a stretching effect in the direction X, the circuit structures 820 and the connection circuits 860 also jointly form a circuitous structure to be used with the second slots 810b and provide a stretching effect in the direction Y.

Figure 18:
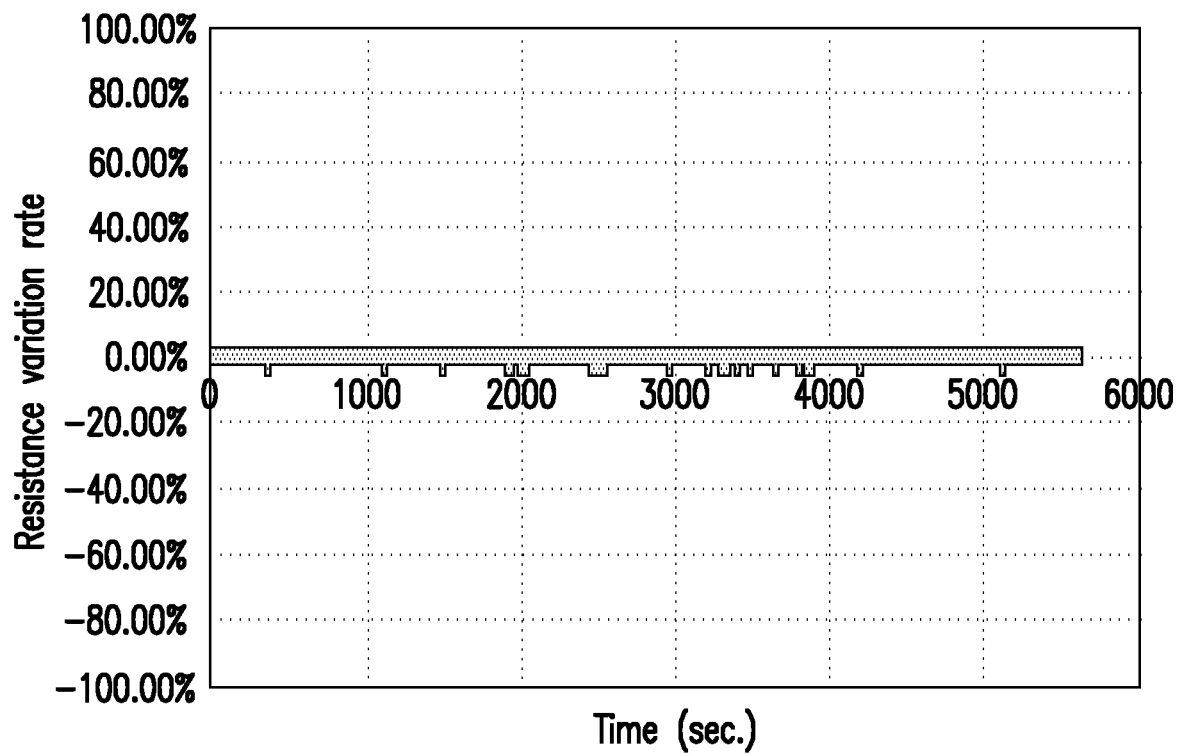
FIG. 18 is a diagram illustrating a resistance variation rate obtained by subjecting a circuit board according to an embodiment of the disclosure to a stretching test.

FIG. 18 is a diagram illustrating a resistance variation rate obtained by subjecting a circuit board according to an embodiment of the disclosure to a stretching test. The test is carried out under the condition that the stretching amount is set at 10% and the stretching time is set to be within about 5500 seconds (1000 repetitive stretching tests). In addition, the test corresponds to a circuit board similar to the circuit board 700 shown in FIG. 14, for example. As shown in FIG. 18, after being stretched for a long period of time, the resistance variation rate of the circuit board according to the embodiment of the disclosure remains to be 5% or less. Accordingly, by designing the circuit structure to not entirely cover the surface of the substrate, the embodiment of the disclosure may effectively reduce the resistance variation rate when the circuit structure is stretched.

Figure 19:
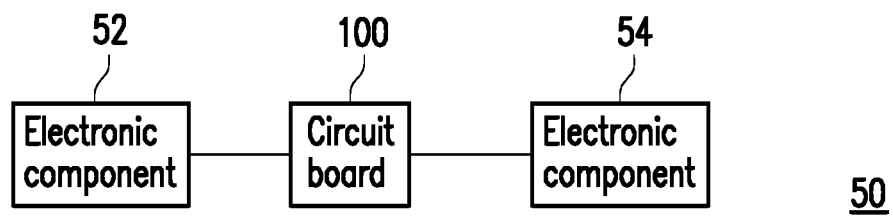
FIG. 19 is a schematic view illustrating an electronic device according to an embodiment of the disclosure.

FIG. 19 is a schematic view illustrating an electronic device according to an embodiment of the disclosure. As shown in FIG. 19, two electronic components 52 and 54 may be electrically connected to each other through the circuit board 100 of the embodiment, so as to form an electronic device 50. The electronic device 50 may be a wearable electronic device, for example, and the two electronic components 52 and 54 may be a human body condition measuring component, an information display component, or a component of other types of the wearable electronic device. The disclosure does not intend to impose a limitation on this regard. In other embodiments, the two electronic components 52 and 54 may be electrically connected to each other through the circuit board according to any of the other embodiments. The disclosure does not intend to impose a limitation on this regard.

Figure 20:
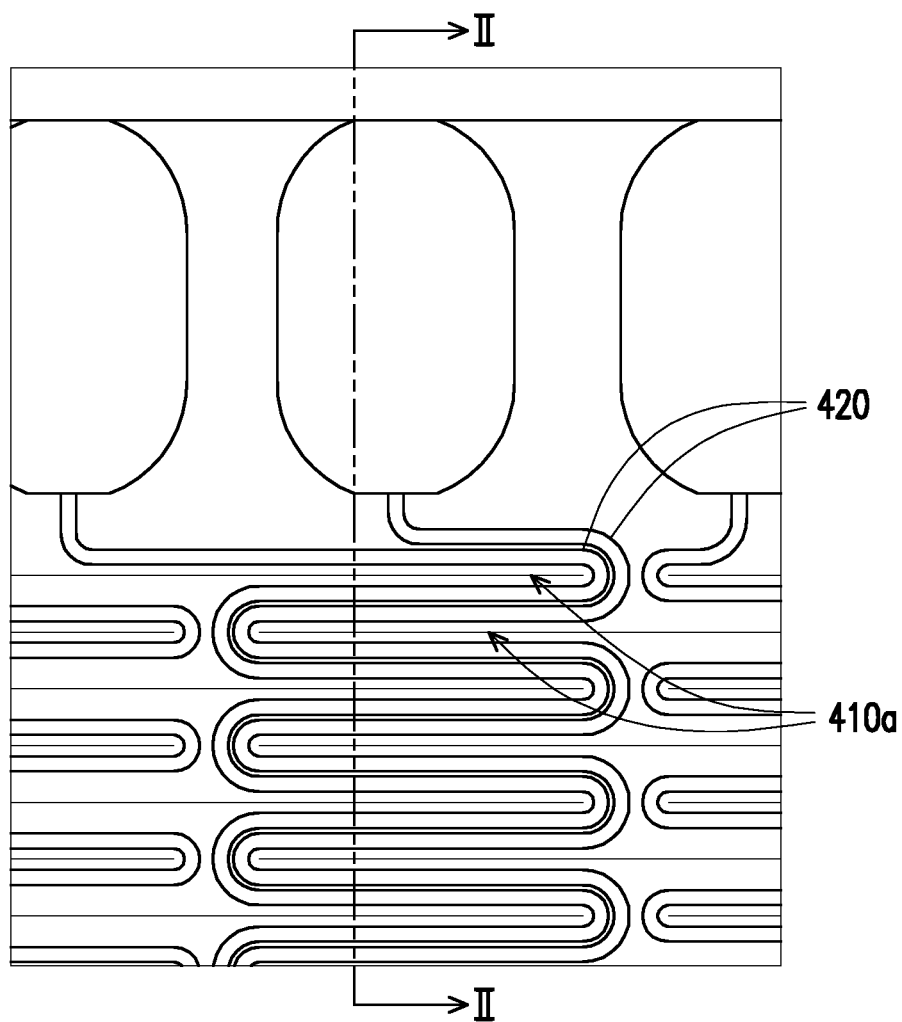
FIG. 20 is a partially enlarged view of the circuit board of FIG. 11.

In addition, the disclosure does not intend to impose a limitation on the number of circuit structures between adjacent two slots of the circuit board. In the following, details in this regard will be described with reference to the circuit board 400 shown in FIG. 11 as an example. FIG. 20 is a partially enlarged view of the circuit board of FIG. 11, wherein FIG. 20 corresponds to a region R2 of FIG. 11. As shown in FIG. 20, two circuit structures 420 are disposed in parallel and extend between adjacent two first slots 410a. In other embodiments, a greater number of circuit structures may be disposed in parallel and extend between adjacent two first slots 410a. The disclosure does not intend to impose a limitation on this regard.

Figure 21:
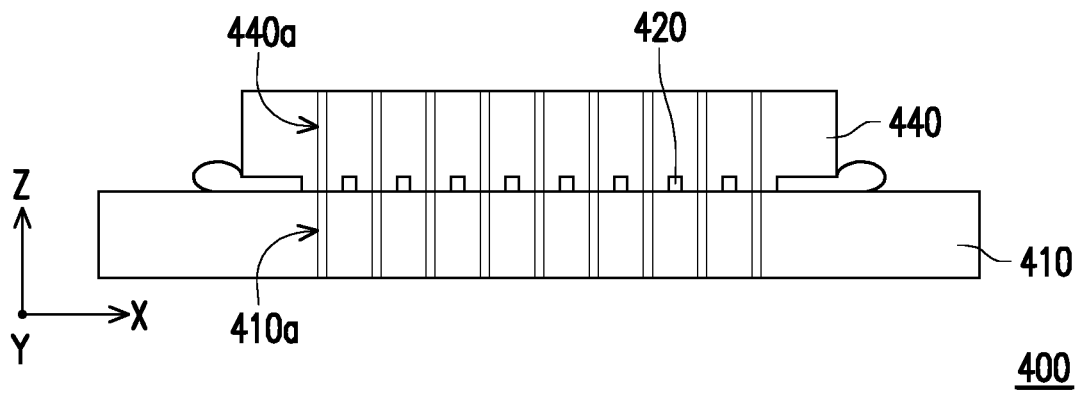
FIG. 21 is a cross-sectional view along a line II-II in the circuit board of FIG. 20.

FIG. 21 is a cross-sectional view along a line II-II in the circuit board of FIG. 20. For clearer illustration, FIG. 21 only schematically illustrates circuit structures 420. The circuit board 400 further includes a protective layer 440. The material of the protective layer 440 is an insulating material, for example. The protective layer 440 is disposed on the substrate 410 to shield the circuit structure 420, so as to prevent the circuit structure 420 from directly contacting an external object and being damaged. The protective layer 440 of FIG. 21 differs from the protective layer 640 of FIG. 13 in that the protective layer 440 directly covers the substrate 410 and the circuit structure 420, instead of using the support structure 650 to support the protective layer 640 away from the substrate 610 and the circuit structure 620 as in the configuration of FIG. 13. That is, the protective layer 440 and the substrate 410 have no interval therebetween. In addition, the protective layer 440 may have a third slot 440a to provide a stretchable effect.

Figure 22:
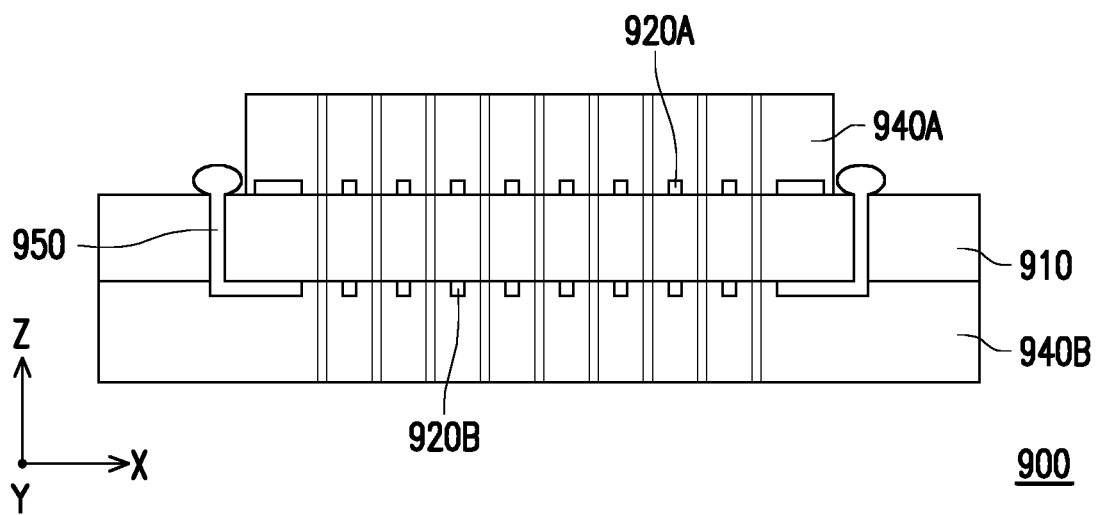
FIG. 22 is a cross-sectional view of a circuit board according to another embodiment of the disclosure.
Figure 23:
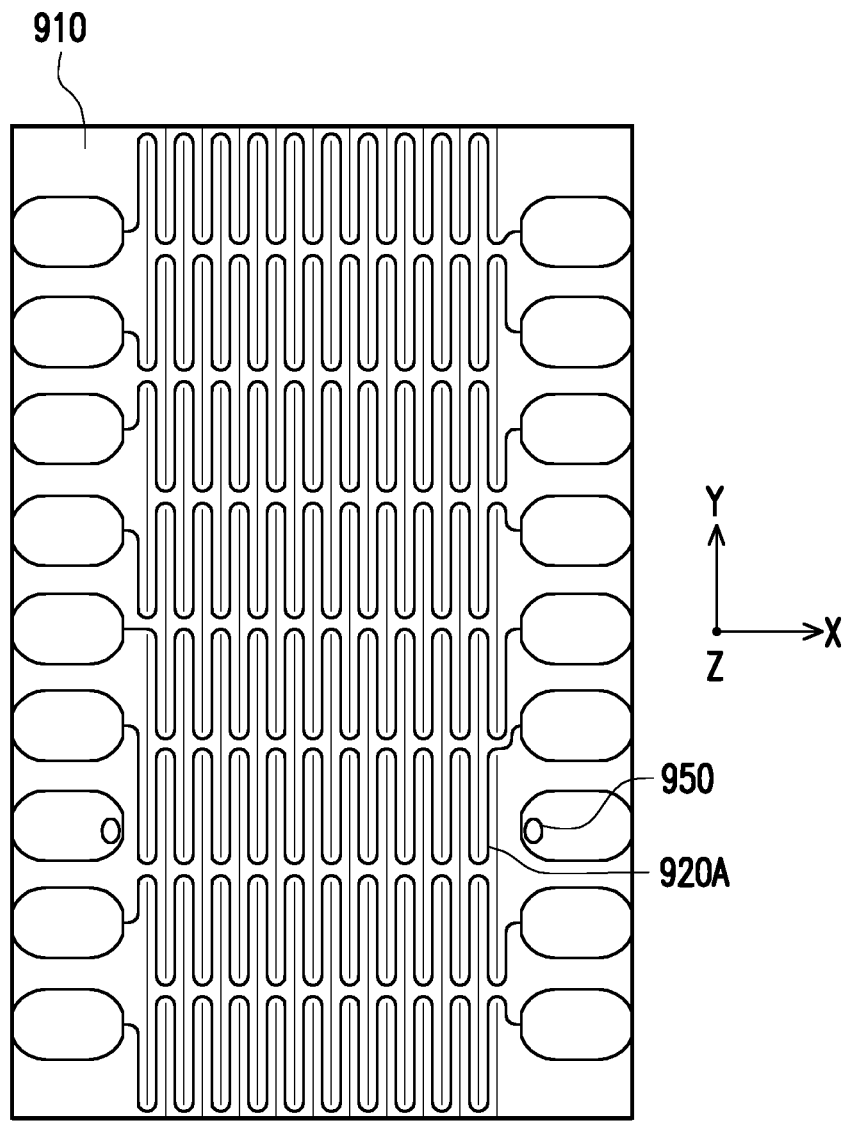
FIG. 23 is a top view of a partial structure of the circuit board (upper layer) of FIG. 22.
Figure 24:
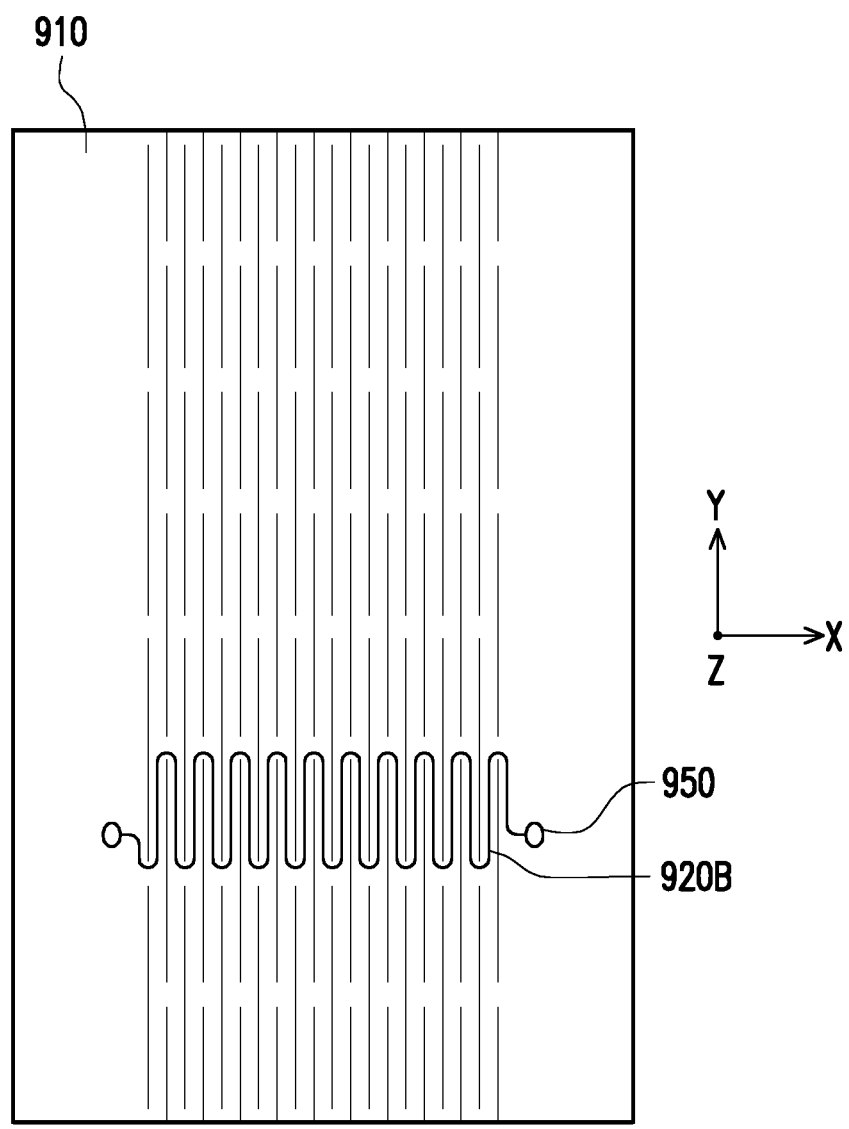
FIG. 24 is a top view of a partial structure of the circuit board (lower layer) of FIG. 22.

More specifically, in other embodiments, the circuit board may exhibit a multi-layer structure, and the parallel circuit structures may be respectively located at different layers of the circuit board. In the following, relevant examples are described with reference to the drawings. FIG. 22 is a cross-sectional view of a circuit board according to another embodiment of the disclosure. FIG. 23 is a top view of a partial structure of the circuit board (upper layer) of FIG. 22. FIG. 24 is a top view of a partial structure of the circuit board (lower layer) of FIG. 22. For clearer illustration, FIG. 22 only schematically illustrates circuit structures 920A and 920B, and protective layers 940A and 940B are omitted in FIGS. 23 and 24. Referring to FIGS. 22 to 24, the partial circuit structure 920A and the other partial circuit structure 920B are respectively disposed on two opposite surfaces of the substrate 910, the protective layers 940A and 940B are respectively disposed on the two opposite surfaces of the substrate 910, and the circuit structures 920A and 920B are respectively shielded by the protective layers 940A and 940B. The circuit structure 920B is electrically connected to a pad on the surface on which the circuit structure 920A is located through a conductive via 950. In other embodiments, the conductive via 950A may be omitted, and a corresponding pad may be disposed on the surface on which the circuit structure 920B is located.

Based on the above, in the circuit board according to the embodiments of the disclosure, the circuit structure and the slot of the substrate have an interval therebetween. In other words, the circuit structure does not entirely cover the surface of the substrate, but only covers a part of the surface of the substrate, so that the circuit structure is not excessively close to the first slot of the substrate. Accordingly, when the circuit board is stretched, the stress concentration occurring at the end of the first slot of the substrate is not directly transmitted to the circuit structure. In this way, the circuit structure may be effectively prevented from being damaged or broken due to stretching of the circuit board. Besides, the extending axis (i.e., the first axis) of the first slot passes through the corresponding arc segment, so that the arc segment is adjacent to the end of the first slot. In this way, the extent of stress concentration may be further reduced by using the arc segment without a pointy tip.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A circuit board, comprising:
   a substrate, having a plurality of first slots, wherein each of the first slots extends along a first axis, and a length of each of the first slots along the first axis is greater than lengths of each of the first slots in other directions;
   at least one circuit structure, disposed on the substrate and comprising a plurality of arc segments and a plurality of extending segments, wherein each of the arc segments is connected between two of the extending segments such that the at least one circuit structure is circuitous, the at least one circuit structure and each of the first slots have an interval therebetween such that each of the first slots and a part of a surface of the substrate are exposed by the at least one circuit structure, each of the first slots is located between adjacent two extending segments of the extending segments, and the first axis of each of the first slots passes through a corresponding arc segment of the arc segments; and
   at least one further circuit structure disposed on the substrate, wherein the first slots continuously extends between the at least one circuit structure and the at least one further circuit structure.

2. The circuit board as claimed in claim 1, wherein the circuit board is adapted to be stretched along a direction perpendicular to the first axis through deformation of the first slots and the arc segments.

3. The circuit board as claimed in claim 1, wherein each of the extending segments is disposed on a straight line.

4. The circuit board as claimed in claim 1, wherein each adjacent two extending segments of the extending segments are parallel to each other or inclined with respect to each other.

5. The circuit board as claimed in claim 1, wherein each of the first slots is a linear slot, an oval slot, a rhombus slot, a rectangular slot, or a hexagon slot.

6. The circuit board as claimed in claim 1, comprising a plurality of connection circuits, wherein the number of the at least one circuit structure is plural, and each of the connection circuits is connected between two of the circuit structures, such that the circuit structures and the connection circuits together form a circuitous structure.

7. The circuit board as claimed in claim 6, wherein the substrate has a plurality of second slots, and each of the second slots is located between adjacent two circuit structures of the circuit structures.

8. The circuit board as claimed in claim 7, wherein each of the second slots extends along a second axis, and the second axis is not parallel to the first axis.

9. The circuit board as claimed in claim 8, wherein the circuit board is adapted to be stretched along a direction perpendicular to the second axis through deformation of the second slots and the connection circuits.

10. The circuit board as claimed in claim 1, wherein the number of the at least one circuit structure is plural, some of the first slots and corresponding circuit structures of the circuit structures are located in a region of the substrate, some other of the first slots and corresponding circuit structures of the circuit structures are located in another region of the substrate, and a design parameter of the first slots and the circuit structures located in the region is different from the design parameter of the first slots and the circuit structures located in the another region.

11. The circuit board as claimed in claim 10, wherein the design parameter comprises a ratio of a length of each of the first slots along the first axis to a distance between each adjacent two first slots of the first slots along a direction perpendicular or parallel to the first axis.

12. The circuit board as claimed in claim 10, wherein the design parameter comprises a shape of each of the first slots.

13. The circuit board as claimed in claim 1, comprising a chip, wherein the chip is disposed on the substrate and electrically connected to the at least one circuit structure.

14. The circuit board as claimed in claim 1, comprising a protective layer, wherein the protective layer is disposed on the substrate and shields the at least one circuit structure, and the protective layer and the substrate have no interval therebetween.

15. The circuit board as claimed in claim 1, comprising a protective layer, wherein the protective layer is disposed on the substrate and shields the at least one circuit structure, and an interval is provided between the protective layer and the substrate.

16. The circuit board as claimed in claim 15, comprising a support structure, wherein the support structure provides support between the substrate and the protective layer to form the interval.

17. The circuit board as claimed in claim 1, wherein the number of the at least one circuit structure is plural, and at least some of the circuit structures are disposed in parallel between adjacent two first slots of the first slots.

18. The circuit board as claimed in claim 1, wherein the number of the at least one circuit structure is plural, some of the circuit structures and some other of the circuit structures are respectively disposed on opposite two surfaces of the substrate.

19. The circuit board as claimed in claim 18, comprising two protective layers, wherein the two protective layers are respectively disposed on the two surfaces of the substrate to shield the circuit structures.

20. The circuit board as claimed in claim 18, wherein some of the circuit structures are electrically connected to the surface on which some other of the circuit structures are located through at least one conductive via.

21. An electronic device, comprising:
   a circuit board, comprising:
      a substrate, having a plurality of first slots, wherein each of the first slots extends along a first axis, and a length of each of the first slots along the first axis is greater than lengths of each of the first slots in other directions;
      at least one circuit structure, disposed on the substrate and comprising a plurality of arc segments and a plurality of extending segments, wherein each of the arc segments is connected between two of the extending segments such that the at least one circuit structure is circuitous, the at least one circuit structure and each of the first slots have an interval therebetween such that each of the first slots and a part of a surface of the substrate are exposed by the at least one circuit structure, each of the first slots is located between adjacent two extending segments of the extending segments, and the first axis of each of the first slots passes through a corresponding arc segment of the arc segments; and at least one further circuit structure disposed on the substrate, wherein the first slots continuously extends between the at least one circuit structure and the at least one further circuit structure; and two electronic components, electrically connected to each other through the circuit board.

22. The electronic device as claimed in claim 21, wherein the circuit board comprises a chip, a passive electronic component, or an active electronic component, and the chip is disposed on the substrate and electrically connected to the at least one circuit structure.

* * * * *